United States Patent [19]

Ray et al.

[11] Patent Number: 5,137,867
[45] Date of Patent: Aug. 11, 1992

[54] SUPERCONDUCTING CERMET FORMED IN SITU BY REACTION SINTERING

[75] Inventors: Siba P. Ray, Plum Boro; C. Norman Cochran, Oakmont; William E. Libent, Vandergrift, all of Pa.

[73] Assignee: Aluminum Company of America, Pittsburgh, Pa.

[21] Appl. No.: 108,998

[22] Filed: Oct. 16, 1987

Related U.S. Application Data

[63] Continuation-in-part of Ser. No. 85,959, Aug. 14, 1987, Pat. No. 4,892,861, which is a continuation-in-part of Ser. No. 86,024, Aug. 14, 1987, abandoned, which is a continuation-in-part of Ser. No. 86,025, Aug. 14, 1987, abandoned.

[51] Int. Cl.$^5$ .................... G01G 12/00; H01L 39/12
[52] U.S. Cl. ........................ 505/1; 505/725; 919/21; 919/45
[58] Field of Search ............... 419/21, 45; 505/1, 725

[56] References Cited

PUBLICATIONS

Advanced Ceramic Materials, Ceramic Superconductors, vol. 2, No. 3b, pp. 388–400; Jul. 1987.
Japanese Journal of Applied Physics, Ba–Y–Cu–O Superconductivity Tape Prepared by Surface Diffusion Process, vol. 26, No. 7, pp. L1172–L1173, Kumakura et al.; Jul. 1987.
F. Beech et al., "Neutron Study of the Crystal Structure and Vacancy Distribution in the Superconductor $Ba_2YCu_3O_{9-\delta}$", *Physical Review B*, vol. 35, No. 16, Jun. 1, 1987, pp. 8778–8781.
P. Chaudhari et al., "Critical-Current Measurements in Epitaxial Films of $YBa_2Cu_3O_{7-x}$ Compound", *Physical Review Letters*, vol. 58, No. 25, Jun. 22, 1987, pp. 2684–2686.
D. R. Clarke, "The Development of High–Tc Ceramic Superconductors: An Introduction", *Advanced Ceramic Materials*, vol. 2, No. 3B, 1987, pp. 273–292.
T. R. Dinger et al., "Direct Observation of Electronic Anisotropy in Single-Crystal $Y_1Ba_2Cu_3O_{7-x}$", Physical Review Letters, vol. 58, No. 25, pp. 2687–2690.
J. W. Ekin, "Transport Critical Current in Bulk Sintered $Y_1Ba_2Cu_3O_x$ and Possibilities for its Enhancement", *Advanced Ceramic Materials*, vol. 2, No. 3B, 1987, pp. 586–592.
K. G. Frase et al., "Phase Compatibilities in the System $Y_2O_3$—BaO—CuO", *Advanced Ceramic Materials*, vol. 2, No. 3B, 1987, pp. 295–302.
R. M. Hazen et al., "Crystallographic Description of Phases in the Y–Ba–Cu–O Superconductor", *Physical Review B*, vol. 35, No. 13, May 1, 1987, pp. 7238–7241.
R. W. McCallum et al., "Problems in the Production of $YBa_2Cu_3O_x$ Superconducting Wire", Advanced Ceramic Materials, vol. 2, No. 3B, 1987, pp. 388–400.
A. J. Panson et al., "Effect of Compositional Variation and Annealing in Oxygen on Superconducting Properties of $Y_1Ba_2Cu_3O_{8-y}$", *Physical Review B*, vol. 35, No. 16, Jun. 1, 1987, pp. 8774–8777.
S. B. Qadri et al., "X-Ray Identification of the Superconducting High-T Phase in the Y-Ba-Cu-O System", *Physical Review B*, vol. 35, No. 13, May 1, 1987, pp. 7235–7237.
Quentin Robinson et al., "Sinter-Forged $YBa_2Cu_3O_{7-\delta}$", *Advanced Ceramic Materials*, vol. 2, No. 3B, 1987, pp. 380–387.
R. S. Roth et al., "Phase Equilibria and Crystal Chemistry in the System Ba–Y–Cu–O", *Advanced Ceramic Materials*, vol. 2, No. 3B, 1987, pp. 303–312.
A. Safari et al., "Processing Study of High Temperature Superconducting Y–Ba–Cu–O Ceramics", *Advanced Ceramic Materials*, vol. 2, No. 3B, 1987, pp. 492–497.
Yoshitami Saito et al., "Composition Dependence of Superconductivity in Y–Ba–(Ag,Cu)–O System", *Japanese Journal of Applied Physics*, vol. 26, No. 5, pp. L832–L833.
J. M. Tarascon et al., "Processing and Superconducting Properites of Perovskite Oxides", *Advanced Ceramic Materials*, vol. 2, No. 3B, 1987, pp. 498–505.

*Primary Examiner*—Stephen J. Lechert, Jr.
*Attorney, Agent, or Firm*—Andrew Alexander

[57] ABSTRACT

An in situ formed superconducting cermet comprising an interwoven matrix of a superconducting ceramic and a noble metal and a method of making same are disclosed. An initial mixture is formed comprising (1) a first reactant selected from the class consisting of one or more noble metals in an oxidized state, and a mixture of one or more oxidized noble metals and one or more noble metals; (2) one or more rare earth-bearing reactants selected from the class consisting of one or more rare earths in an oxidized state, one or more rare earths in elemental form, and a combination thereof; (3) one or more alkaline earth-bearing reactants selected from the class consisting of one or more alkaline earth metals in an oxidized state, one or more alkaline earth metals, and a combination thereof; and (4) a copper based reactant selected from the class consisting of copper oxide, an oxide of a copper base alloy, elemental copper, a copper base alloy, and a combination of two or more thereof; wherein at least one of said rare earth-bearing, alkaline earth metal-bearing, or copper based reactants is in elemental form. The mixture of reactants is reaction sintered together to reduce at least a portion of the first reactant and to oxidize at least a portion of the other reactants to form a superconducting cermet in situ consisting essentially of an interwoven matrix of a noble metal and a superconductive ceramic.

21 Claims, No Drawings

SUPERCONDUCTING CERMET FORMED IN SITU BY REACTION SINTERING

CROSS-REFERENCE TO RELATED APPLICATIONS

This application is a continuation-in-part of Ray application Ser. No. 085,959, U.S. Pat. No. 4,892,861; Ray application Ser. No. 086,024, now abandoned; and Ray application Ser. No. 086,025, abandoned; all filed on Aug. 14, 1987.

BACKGROUND OF THE INVENTION

1. Field of the Invention

This invention relates to a superconducting cermet material formed from a triple-layer perovskite type superconducting ceramic material and one or more precious metals or alloys thereof, or metals or alloys thereof more noble than copper; and a method of making the superconducting cermet.

2 Description of the Related Art

Since the discovery of superconductivity in 1911, the phenomena of a material being able to conduct electricity with almost no resistance when the material is cooled to a temperature approaching absolute zero (0° K.) has remained an interesting scientific curiosity having few applications which would justify the expense of maintaining the necessary liquid helium cooled system.

Recently, however, superconducting ceramic materials have been produced which exhibit this phenomena at much higher temperatures, e.g., the boiling point of liquid nitrogen which boils at about 77° K. The ability to produce superconductivity in a material cooled by liquid nitrogen completely changes the economics which have previously restricted the applications to which superconductivity could be applied.

These new ceramic materials are sometimes referred to as triple-layer perovskite compounds because of the crystallography of the resulting structure; or 1-2-3 compounds because of the atomic ratios of 1 atom of a rare-earth element such as in the Lanathanide series (La, Nd, Pm, Sm, Eu, Gd, Dy, Ho, Er, Tm, Yb, Lu) or yttrium; 2 atoms of an alkaline earth metal such as barium or strontium; and 3 atoms of copper. The superconducting ceramic also contains from 6.5+ to 7− atoms of oxygen which is usually referred to as $O_{(6.5+x)}$ where x is greater than 0 and less than 0.5, resulting in a chemical formula such as, for example, $YBa_2Cu_3O_{(6.5+x)}$.

Saito et al in an article entitled "Composition Dependence of Superconductivity in Y-Ba-(Ag, Cu)-O System" in the *Japanese Journal of Applied Physics*. Vol. 26, No. 5, May, 1987, pp. L 832-833, (incorporated herein by reference) have substituted silver for copper in the superconducting ceramic and found that as the level of silver was increased, superconducting capability decreased with temperature, particularly at higher levels of silver. While the superconducting properties of such a ceramic material have been confirmed by demonstration of the Meissner effect wherein the superconductor, when cooled to superconducting temperature, will exhibit magnetic properties sufficient to levitate a magnet above the superconductor, the material is deficient in some of the essential physical properties needed to permit fabrication and practical usage of structures from the material.

Most notable of these deficiencies is the extreme brittleness and poor mechanical strength of the superconducting ceramic structures which inhibits formation of shaped structures, e.g., coils or wires therefrom; and the low current carrying capabilities of the superconducting ceramic. The superconducting ceramic material also shows evidence of microcracking which is a further indication of its brittleness and would also effect its transport critical current density $J_c$ (at zero magnetic field). Most applications of the new high $T_c$ superconductors require high critical current densities ($J_c$) of more than $10^4$–$10^5$ A/cm$^2$, often in the presence of a significant magnetic field (1–10 Tesla). Critical current density $J_c$ in bulk sintered samples of $YBa_2Cu_3O_{6.5+x}$ are typically $10^2$–$10^3$ A/cm$^2$ only. In a magnetic field, these values are even lower. Thus there is great need for improved critical properties (see "Transport Critical Current in Bulk Sintered $Y_1Ba_2Cu_3O_x$ and Possibilities for its Enhancement", J.W. Ekin, Advanced Ceramic Materials, Vol. 2, No. 3B, Special Issue, 1987, incorporated herein by reference). In addition, the superconducting ceramic material, as produced, is of rather low density, i.e., about 60–75% of theoretical density, and is difficult to densify, resulting in a low environmental stability and a sensitivity to moisture and $CO_2$. Low density also leads to poor superconducting and mechanical properties.

It would, therefore, be of great value to be able to produce a compound or structure from such ceramic superconducting material which would, while preserving the superconducting effects of the ceramic, have superior mechanical strength, exhibit less brittleness (i.e., be more malleable), improve critical current density capabilities, reduce or eliminate microcracking, and have a higher density, as well as improving the environmental durability of the material.

In parent applications Ray Ser. No. 085,959, entitled "Liquid Phase Sintered Superconducting Cermet"; Ray Ser. No. 086,024, entitled "Polycrystalline Superconducting Cermet"; and Ray Ser. No. 086,025, entitled "Superconducting Cermet"; all filed on Aug. 14, 1987 and all assigned to the assignee of this invention, there are disclosed and claimed superconducting cermets, and methods of making same, by sintering together a mixture of a superconducting ceramic and one or more noble metals or metal alloys thereof The noble metal, or alloys thereof, sintered with the superconducting ceramic preferably comprise one or more noble metals, e.g., gold, silver, and the six platinum metals, or alloys which include same, while the superconducting ceramic is, generally, of the triple layer perovskite or 1-2-3 type compounds.

However, in those applications, it is generally contemplated that the superconducting ceramic material will be first formed and then the superconducting ceramic material will be mixed with the noble metal and the mixture then sintered

SUMMARY OF THE INVENTION

It would be advantageous to provide a method of making such a superconducting cermet wherein the two steps of respectively forming the superconducting ceramic and then forming the superconducting cermet could be combined into a single step. Not only would this result in a savings of an additional process step, but such a single step process can result in a more complete dispersal of the noble metal throughout the resulting cermet in an interwoven matrix of conducting material and superconducting material. Furthermore, in situ formation of the superconducting cermet may, in certain circumstances, also result in elimination of the subsequent oxidation step.

It is, therefore, an object of this invention to provide a superconducting cermet by reaction sintering together a mixture of one or more metals, metals salts, and metal oxides capable of reacting together to form an interwoven matrix of a metallic conductor and a ceramic superconductor.

It is another object of this invention to provide a superconducting cermet by reaction sintering together one or more metal oxides, metal salts or mixtures of same of one or more noble metals with a mixture of one or more rare earth-bearing reactants, one or more alkaline earth metal-bearing reactants, and one or more copper based reactants wherein at least one of the rare earth-bearing, alkaline earth metal-bearing, or copper based reactants is in elemental form.

It is a further object of this invention to provide a superconducting cermet by reaction sintering together one or more oxides, salts or mixtures of same of one or more noble metals; with a mixture of one or more rare earth-bearing reactants, one or more alkaline earth metal-bearing reactants, and one or more copper based reactants in a stoichiometric ratio capable of producing an interwoven matrix of the noble metal and a superconducting ceramic having the formula $R_{1+z}M_{2-z}(Cu_{1-y}N_y)_3O_{(6.5+x)}$ wherein R is one or more rare earth elements capable of reacting to form a superconducting ceramic, M is one or more alkaline earth metal elements capable of reacting to form a super conducting ceramic, x is greater than 0 and less than 0.5, y is 0 to 0.5, z is 0 to 0.6, and N is a mono-, di-, or trivalent metal; and wherein at least one of the initial rare earth-bearing reactants, alkaline earth metal-bearing reactants, or copper based reactants is in elemental form prior to said reactive sintering.

It is yet another object of this invention to provide a superconducting cermet by reaction sintering together one or more metal oxides, metal salts or mixtures of same of one or more noble metals; with a mixture of one or more rare earth- bearing reactants, one or more alkaline earth metal-bearing reactants, and one or more copper based reactants wherein at least one of the initial rare earth-bearing reactants, alkaline earth metal-bearing reactants, or copper based reactants is in elemental form and a sufficient amount of said initial reactants are in oxide form to supply oxygen to said reaction in an amount sufficient to permit elimination of a subsequent oxidation step.

It is still a further object of this invention to provide a superconducting cermet by reaction sintering together one or more metal oxides, metal salts or mixtures of same of one or more noble metals; with a mixture of one or more rare earth-bearing reactants, one or more alkaline earth metal-bearing reactants, and one or more copper based reactants wherein at least one of the initial rare earth-bearing reactants, alkaline earth metal-bearing reactants, or copper based reactants is in elemental form and wherein the initial reactants are chosen to provide an exothermic reaction capable of sustaining itself after initial propagation.

It is yet a further object of this invention to provide a superconducting cermet by reaction sintering together 1) one or more metal oxides, metal salts or mixtures of same of one or more noble metals; 2) a mixture of one or more rare earth-bearing reactants, one or more alkaline earth metal-bearing reactants, and one or more copper based reactants wherein at least one of the initial rare earth-bearing reactants, alkaline earth metal-bearing reactants, or copper based reactants is in elemental form; and 3) an amount of previously formed superconducting ceramic material; wherein the previously formed superconducting ceramic is used to control the amount of exothermic heat generated in the reaction sintering step. It is still a further object of this invention to provide a superconducting cermet by reaction sintering together 1) one or more metal oxides, metal salts or mixtures of same of one or more noble metals; 2) a mixture of one or more rare earth-bearing reactants, one or more alkaline earth metal-bearing reactants, and one or more copper based reactants wherein at least one of the initial rare earth-bearing reactants, alkaline earth metal-bearing reactants, or copper based reactants is in elemental form; and 3) an amount of the noble metal in elemental form; wherein the noble metal in elemental form is used to control the amount of exothermic heat generated in the reaction sintering step.

It is a further object of this invention to provide a superconducting cermet by reaction sintering together a shaped object formed from 1) one or more metal oxides, metal salts or mixtures of same of one or more noble metals; 2) a mixture of one or more rare earth-bearing reactants, one or more alkaline earth metal-bearing reactants, and one or more copper based reactants wherein at least one of the initial rare earth-bearing reactants, alkaline earth metal-bearing reactants, or copper based reactants is in elemental form and wherein the initial reactants are chosen to provide an exothermic reaction capable of sustaining itself after initial local propagation at a selected area of the shaped object.

These and other objects of the invention will be apparent from the following description.

DETAILED DESCRIPTION OF THE INVENTION

In accordance with the invention, a superconducting cermet is formed in situ consisting essentially of an interwoven matrix of a metal more noble than copper, i.e., a noble metal, and a superconducting ceramic. The superconducting cermet is characterized by a higher flexure strength, i.e., less brittleness and higher density as well as an absence of microcracking, as compared to the superconducting ceramic material therein when measured by itself.

The superconducting cermet is formed, in accordance with the present invention, by reaction sintering together the reactants containing the elements normally used in forming the superconducting ceramic and one or more additional reactants containing the desired noble metal. The resultant product is an interwoven matrix of the noble metal and a superconducting ceramic conforming to the general formula $R_{1+z}M_{2-z}(Cu_{1-y}N_y)_3O_{(6.5+x)}$ wherein R is one or more rare earth elements capable of reacting to form a superconducting ceramic, M is one or more alkaline earth metal elements capable of reacting to form a super conducting ceramic, x is greater than 0 and less than 0.5, y is 0 to 0.5, z is 0 to 0.6, and N is a mono-, di-, or trivalent metal. In a more specific or simplified case, the formula for the superconducting ceramic may be written as $RM_2Cu_3O_{(6.5+x)}$ wherein R, M, and x are as defined above.

Reaction sintering, in its simplest form, comprises a redox reaction in which a first metal, in reduced form, is reacted with another metal in oxidized form to oxidize the reduced metal and reduce the oxidized metal as shown below:

$$M_1 + M_2O \rightarrow M_1O + M_2$$

Usually, however, the term reaction sintering refers to a multiple reactant system wherein two or more of the reactants also react together to form a single reaction product such as, for example, the interwoven matrix described in Ray U.S. Pat. No. 4,454,015 wherein metallic iron is reaction sintered with a mixture of nickel oxide and iron oxide to form an interwoven matrix of nickel-iron oxides and a nickel-iron alloy.

Therefore, in the context of the present invention, the choice of initial reactants, used in forming the superconducting cermet in situ, in accordance with the invention, by reaction sintering, must meet the following criteria:

I. The reactants used must include elements capable of forming a superconducting ceramic material (although further treatment of the resultant reaction mass with a source of oxygen is within the scope of the invention) and the presence of other reactants in the mixture must not inhibit this formation of the superconducting ceramic;

II. The reactants used must include one or more elements capable of forming a conductive material which will be thoroughly dispersed through the superconducting ceramic to form an interwoven matrix of the two reaction products; and III. The choice of the chemical state of each of the reactants (reduced form, salt, or oxide) must be such that the reaction sintering reaction is thermodynamically possible.

With respect to the third requirement, it should be further pointed out that the first two requirements, in addition to necessitating the right choice of elements, also require judicious choice of the form in which the reactant element is present as well. For example, sufficient oxide must be present to permit formation of the desired superconducting ceramic which dictates that either a) at least some of the reactants should be in oxide form or b) an oxygen-bearing reactant (including air) must also be included. Furthermore, the choice of oxidizable and reducible reactants must be such as to provide the noble metal in reduced form after the reaction sintering reaction has occurred.

Before, however, discussing further the interaction between the reactants during the reaction sintering reaction, the reactant requirements of I and II above will be respectively discussed.

To form a superconducting ceramic having the general formula: $R_{1+z}M_{2-z}(Cu_{1-y}N_y)_3O_{(6.5+x)}$ discussed above, the reactants must include one or more rare earth-bearing reactants capable of reacting to form a superconducting ceramic; one or more alkaline earth-bearing reactants capable of reacting to form a superconducting ceramic; and one or more copper based reactants capable of reacting to form a superconducting ceramic. The rare earth-bearing reactants useful in the practice of the invention comprise those Group IIIB elements of the periodic table capable of reacting with the other reactants to be described to form a superconducting ceramic. By Group IIIB elements is meant scandium, yttrium, and the lanathanide series of elements (La, Nd, Pm, Sm, Eu, Gd, Dy, Ho, Er, Tm, Yb, Lu). These elements may be present as reactants in reduced or oxidized form, including oxides and salts such as carbonates and nitrates. If the rare earth-bearing reactant is in salt form, the reactant preferably will include an anion which will decompose without leaving any residue not included in the desired reaction products. More preferably, the anion will be an oxygen-bearing decomposable anion. As stated above, the rare earth-containing reactant comprises any of the Group IIIB elements capable of forming a superconducting ceramic with the other reactants. Therefore, the rare earth may comprise any lanthanide series rare earth with the possible exception of cerium and praseodymium, which have not, to date, been successfully reacted to form such superconducting ceramic material. Preferred rare earth elements include lathanum and yttrium.

The one or more alkaline earth metal-bearing reactants may include any Group IIA metal in the periodic chart capable of reacting to form the desired superconducting ceramic. Preferably, however, the alkaline earth metal will at least include barium or strontium or combinations thereof, with barium-bearing reactants particularly preferred. As in the case of the rare earth-bearing reactant, the alkaline earth metals may be present as reactants in reduced or oxidized form, including oxides and slats such as carbonates and nitrates. Again, like the rare earth-bearing reactant, if the alkaline earth metal-containing reactant is in salt form, the reactant preferably will include an anion which will decompose without leaving any residue not included in the desired reaction products. More preferably, the anion will be an oxygen-bearing decomposable anion.

The third reactant used in forming the desired superconducting ceramic comprises one or more copper based reactants. By the term "copper based" is meant a reactant which will include copper as the major cationic constituent. By "major" is meant that at least 50 wt.% of the cation consists of copper. Thus elemental copper, alloys containing at least 50 wt.% copper, and slats and/or oxides of copper or such copper alloys are included in the term copper based reactant. As in the cases of the rare earth-bearing reactant or the alkaline earth metal-bearing reactant, if the copper based reactant is in salt form, the reactant preferably will include an anion which will decompose without leaving any residue not included in the desired reaction products. More preferably, the anion will be an oxygen-bearing decomposable anion.

The ratio of the rare earth-bearing, alkaline earth metal-bearing, and copper based reactants to each other in the reaction mixture should comprise the proper stoichiometry needed to form the desired superconducting ceramic interwoven with the noble metal as expressed by the general formula $R_{1+z}M_{2-z}(Cu_{1-y}N_y)_3O_{(6.5+x)}$ previously discussed above.

While the foregoing individual discussions of each of the three reactants used in forming the desired superconducting ceramic in the interwoven matrix comprising the superconducting cermet of the invention has included the provision that the respective rare earth-bearing, alkaline earth metal-containing, or copper based reactant may be in an oxidized form such as an oxide or an oxygen-bearing anion, it will be understood, as will be discussed in more detail below, that at least one or more of these reactants will need to be in reduced form for purposes of the reaction sintering reaction.

The fourth reactant or reactant group used in forming the superconducting cermet of the invention comprises, at least in part, the reducible material which, after the reaction sintering step, will comprise a noble metal, e.g., a metal more noble than copper, with which the superconducting ceramic will be interwoven. This reactant, in addition to comprising, at least in part, a reducible material, must, therefore, comprise a material which will, after the reaction sintering step, exhibit the desired properties, e.g., substantially inert with respect to the superconducting ceramic or atmosphere, to provide enthalpy stabilization, and also aid in forming.

In accordance with the invention, the cationic portion of this fourth reactant will, therefore, consist essentially of a noble metal. The term "noble metal", as used herein, may, therefore, be defined as a precious metal, an alloy of a precious metal wherein the precious metal comprises at least 50 wt.% of the alloy, or a diamagnetic metal or metal alloy which is more noble than the copper based reactant used in the mixture. Furthermore, the metal, or metal alloy, should not react to form a stable compound with oxygen at the reaction sintering temperature; should not alloy with the metals in the superconducting ceramic; and preferably should melt at a temperature lower than the reaction sintering temperature, e.g., approximately 900° C. By the term "precious metal" is meant silver, gold, or one of the six platinum metals, i.e., Group VIII metals 44-46 and 76-78, or any alloy consisting essentially of mixtures of such metals.

In accordance with the invention, at least a portion of the fourth reactant must be in reducible form. The oxidized Portion of the fourth reactant may comprise an oxide or a salt such as a sulfide or a halide such as chloride or fluoride. Preferably, the oxidized metal reactant will comprise either an oxide or a decomposable oxygen-bearing anion such as a nitrate or a carbonate or an organic material such as an oxalate or a citrate.

The amount of the fourth reactant group in the reaction mixture, relative to the other three reactants groups, will vary depending upon the stoichiometric proportions of the oxidized portion of the fourth reactant relative to the oxidizable amounts of the other three reactants groups to permit the reaction sintering reaction to proceed properly However, the total amount of reactants in the fourth group, including already reduced noble metal or metals, will be controlled by the desired amount of noble metal to be present in the resulting interwoven matrix of noble metal and superconducting ceramic resulting from the reaction sintering step. The amount of noble metal in the resulting interwoven matrix may vary from as little as 5 volume percent (vol.%) precious metal and 95 vol.% superconducting ceramic to as high as a 50/50 vol.% mixture of precious metal to superconducting ceramic. Preferably the ratio will be from about 5 to 30 vol.%, and more preferably from about 15 to 30 vol.%, precious metal in the powder mixture to achieve the desired increase in both mechanical and electrical properties while still retaining the superconductive characteristics in the resulting cermet.

Particularly preferred of the noble metals which may be used to form the fourth reactant group are silver and a silver based alloy, i.e., an alloy containing at least 50 wt.% silver. Such silver-bearing reactants include silver oxide, silver carbonate, silver nitrate, and organo silver compounds, as well as, in some instances, silver sulfide, silver halide, etc. because they can be easily made available in fine particulate form and, when heated to the preferred sintering temperature, the silver compound will decompose at 230° C. to silver and the corresponding anion such as oxygen and the silver will then melt at 962° C. to provide a liquid phase sintering aid or densification agent. Furthermore, when silver oxide is used, the oxide from the decomposed silver oxide can be used as a source of oxygen when the sintering step is carried out in a sealed vessel and the subsequent oxygen annealing step is carried out in the same vessel by cooling the cermet from the sintering temperature down to the annealing temperature. Preferred silver-bearing reactants comprise decomposable silver compounds, particularly oxygen-bearing decomposable silver-bearing compounds. Most preferred is silver oxide since it is unstable at the reaction sintering and annealing temperatures employed, thus assuring the presence of the noble metal in reduced form in the interwoven matrix comprising the superconducting cermet. To carry out the in situ formation of the interwoven matrix of noble metal and superconducting ceramic by reaction sintering, it is necessary that at least one of the reactants which will be in reduced form in the product must be initially in oxidized form and at least one of the reactants which will be in oxidized form in the final product must be initially in reduced form. To illustrate this, using a yttrium-bearing material as the rare earth-bearing reactant, a barium-bearing material as the alkaline earth metal-bearing reactant, copper as the copper based reactant, and a silver-bearing material as the conductive material, the following partial equations may be written to illustrate the redox portion of the reaction:

$$Y + 3/2\ Ag_2O \rightarrow 1/2 Y_2O_3 + 3Ag \text{ plus heat} \qquad (1)$$

$$Cu + Ag_2O \rightarrow CuO + 2Ag + \text{heat} \qquad (2)$$

$$Ba + Ag_2O \rightarrow BaO + 2Ag + \text{heat} \qquad (3)$$

Adding the remaining reactants needed to form the superconducting ceramic in an interwoven matrix with the reduced silver results in the following respective equations:

$$Y + 3/2 Ag_2O + 2BaO + 3CuO \rightarrow 3Ag + YBa_2Cu_3O_{6.5} \qquad (4)$$

$$3Cu + 3Ag_2O + 1/2Y_2O_3 + 2BaO \rightarrow 6Ag + YBa_2Cu_3O_{6.5} \qquad (5)$$

$$2Ba + 2Ag_2O + 1/2Y_2O_3 + 3CuO \rightarrow 4Ag + YBa_2Cu_3O_{6.5} \qquad (6)$$

In equation (4), the amount of exothermic heat given off is 195 Kcals/mole while the exothermic heat given off in equation (5) is 90 Kcals/mole. Since the amount of silver, per mole of superconducting ceramic, is twice as much in equation (5) as in equation (4), the interwoven matrix produced when reaction sintering the reactants of equation (5) will have a higher density than that of equation (4). Equation (6) will usually not be preferred because of the difficulty which may be encountered in using reduced barium. It should, however, be noted that the above equations are only by way of example. It may be preferred, in some instances, to utilize mixtures, e.g., alloys of the oxidizable component, e.g., a Y-Ba, Y-Cu, or Ba-Cu alloy as well as a Y-Ba-Cu alloy. It should also be pointed out that mixtures of the individual oxidizable reactants in reduced form, as well as mixtures of individual oxidizable reactants and their alloys, and mixtures of oxidized and partially oxidized reactants with oxidizable reactants in reduced form are also possible. For example, the reactant mixture used in forming the superconducting ceramic portion of the cermet could include a mixture of Y, $Y_2O_3$, Ba, BaO, Cu, $Cu_2O$, and alloys of the three elements as well, as long as there was a sufficient amount of oxidizable reactants present to carry out the desired in situ reaction sintering in stoichiometric balance with the noble metal in oxidized form.

Furthermore, to control the amount of exothermic heat generated during the reaction sintering, the amount of noble metal, e.g., silver, in oxidized form may be reduced and the difference made up with metallic silver. Correspondingly, for example, the amount of reduced Y, Ba, or Cu, or alloy thereof, in the equations above would also be reduced and made up with oxidized yttrium or copper to maintain the stoichiometric balance of reducible and oxidizable reactants in the sinterable mixture The heat of reaction may also be controlled by adding some. previously formed superconducting ceramic material and reduced noble metal while maintaining a stoichiometric balance between the reactants.

The exothermic heat given off during the reaction sintering may be used to continue the propagation of the reaction without further input of heat after initiation of the reaction. Furthermore, the generation of exothermic heat may permit local initiation of the exothermic reaction which is then allowed to propagate along a predetermined path, for example, when the reaction mixture is preformed into a desired shape.

For example, the reaction mixture could be spread on a substrate as a coating of patterned lines and the reaction then allowed to propagate along the pattern after being locally initiated at one end of the pattern.

Similarly, the reaction mixture could be molded into three dimensional shapes, spread as a three dimensional coating such as a coating over a wire which might, for example, comprise a copper or copper bearing alloy which could then enter into the reaction as well, or the wire might comprise a precious metal or alloy thereof.

The reaction mixture could also be encased in a metal tube which could be a copper-bearing material or a precious metal-bearing material. In such a case, the filled metal tube could then be drawn down to a smaller diameter with thinner walls after the filling step but prior to the reaction sintering step. Local initiation of the exothermic reaction sintering would then result in a reaction which, due to its exothermic nature and the amount of heat produced, would propagate along the length of the tube resulting in an interwoven matrix of superconductive ceramic and noble metal encased in a metallic sleeve which could then be utilized as a conductive cable.

The superconducting cermet of the present invention may be sprayed on a substrate, such as a metal, e.g., precious metal, substrate or onto a polymer substrate or on a formed or shaped substrate. Layers of sprayed substrates may be provided to provide a composite. If the layers are provided by rolling a body of the superconducting cermet then the grains can be provided in a highly or preferred orientation so as to enhance critical current density. If desired, the substrate may be a metal interleafed between the cermet layers to form a composite. Such a composite may then be further worked, e.g., rolled, drawn or extruded, further facilitating orientation of the grains to provide enhanced properties. In addition, the superconducting cermet of the present invention provides for easier connections to normal conductors.

The reactant mixture used in producing the superconducting cermet of the invention is formed by thoroughly mixing the initial reactants together as powders of $-100$ mesh (Tyler) or smaller particle size, to form a homogeneous mixture with uniform distribution of the reactants. This may be accomplished by ball milling or grinding the powders until a homogeneous mixture is formed. The powder mixture may then optionally pressed into a compact form, placed into a tube, mixed with a binder to form a coating, etc.

The reactant mixture, regardless of its form or shape, may then be heated to a temperature of from about 900–1000° C. to initiate the reaction sintering. Depending upon the amount of exothermic heat generated during the reaction sintering, no further input of heat may be necessary and the reaction may be completed in a short period time, e.g., as little as 10–20 minutes. However, if the ratio of respectively reducible and oxidizable reactants used is low, or the amount of exothermic heat is not sufficient to maintain the reaction, the reactant mixture may be maintained at this temperature range for as long as about 12 to 36 hours to form the superconducting cermet. Longer times at temperature can be used in order to provide homogeneity. The sintering step may be carried out in air or any other oxygen-bearing atmosphere. Preferably, the sintering vessel may be a sealed vessel to retain any oxygen lost during the sintering step, since this oxygen may be utilized in a subsequent annealing step. Depending upon the reactants used, the reaction, after initiation, may be carried out without the need for additional heat.

The resulting cermet may be annealed in an oxygen-bearing atmosphere at ambient pressure at a temperature of from about 650–750° C. for a period of from about 12–36 hours, preferably about 24–36 hours to raise the oxygen content of the superconducting ceramic from 6.5 to just under 7 in the formula $R_{1+z}M_{2-z}(Cu_{1-y}N_y)_3O_{(6.5+x)}$ discussed above or the more specific formula $RM_2Cu_3O_{(6.5+x)}$ also discussed above.

In a preferred embodiment, the oxygen treating step, when necessary, may be carried out without removing the cermet from the sintering vessel by merely reducing the temperature of the reaction mass in the sintering vessel to 400–750° C. and then maintaining the cermet at this temperature for an additional period of up to 36 hours in the presence of an oxygen-bearing atmosphere at ambient or higher pressure.

The resulting cermet is found to be of much higher flexure strength than the corresponding ceramic from which it was made with higher current carrying capabilities due to the presence of the precious metal in the cermet. Examination of the cermet also reveals an absence of the microcracking found in the corresponding ceramic material.

The cermet of the invention may be further worked or densified by forging to fabricate the cermet into a shaped object or by extruding the cermet to form wire therefrom.

An important feature of the present invention results from the addition of the precious metal. That is, it has been discovered that the critical current density of the cermet can be increased over that of the superconducting ceramic used in making the cermet. By critical current density is meant the current density above which a superconductor loses its superconducting state. The importance of critical current density is disclosed in a paper by Chaudhari et al entitled "Critical-Current Measurements in Epitaxial Films of $YBa_2Cu_3O_{7-x}$ Compound", *Physical Review Letters*, Vol. 58, No. 25, Jun. 22, 1987, pp. 2684-6 (incorporated herein by reference). Thus, it will be understood that the higher the critical current density, the greater the efficiency and usefulness of the superconductor. Further, it will be understood that one condition which contributes to increasing the critical current density is orientation of the grains. For example, in the superconducting ceramic having the formula $Ba_2YCu_3O_{9-L}$ where $L = 2.0$ to 2.5 current in the superconducting mode moves most readily in the Cu-O plane, as shown in the paper by Beech et al entitled "Neutron Study of the Crystal Structure and Vacancy Distribution in the Superconductor $Ba_2YCu_3O_9$-", *Physical Review* B, Vol. 35, No 16, Jun. 1, 1987, pp. 8778–81 (incorporated herein by reference). It will be understood that in ceramic materials generally it is difficult to change the shape of or orient the grains in a ceramic matrix. However, it is desirable to orient crystallites in the material so that the strong superconducting axes are parallel to the direction of transport current. During the mechanical deformation of the ceramic or cermet, e.g., hot forging or extrusion, the grain orientation is achieved due to the anisotropic mechanical properties of the ceramic grains. Thus, preferred orientation can be achieved during mechanical processing, for example It is believed that silver or other metals aid in achieving the preferred grain orientation while still maintaining superconductivity. The preferred orientation improves the critical current density.

In another aspect of the invention, the cermet of the present invention has the advantage that it has increased stabilization, as compared to the superconducting ceramic. That is, the cermet, because of the precious metals added in accordance with the invention, has enthalpy stabilization provided in-situ. The cermet of the present invention preferably contains at least two continuous phases containing, respectively, superconducting ceramic and a noble metal. The stabilizer may be interwoven with the superconducting ceramic. This aspect of the invention contemplates in-situ or interwoven stabilizers into any type of superconducting ceramic. Additional enveloping type stabilizers may be provided to further enhance stability. Silver is used in the present invention as a stabilizer by way of example and not of limitation. Silver or other precious metals or alloys thereof may be used as stabilizers.

Further use of precious metals to form a superconducting cermet in accordance with the present invention permit anisotropic electronic behavior so as to be used in the good conducting directions, for example, along the Cu-0 planes, as explained by Dinger et al in an article entitled "Direct Observation of Electronic Anisotropy in Single-Crystal $Y_1Ba_2Cu_3O_{7-x}$", *Physical Review Letters*, Vol. 58, No. 25, Jun. 22, 1987 (incorporated herein by reference). Thus, the present cermet can be formed, i.e., by hot forging or extruding, to provide anisotropic conditions so as to enhance or provide supercurrent-carrying capabilities and to control current flow in certain directions.

To further illustrate the practice of the invention, a 48.7 gram reaction mixture containing 8.65 wt.% $Y_2O_3$, 23.49 wt.% BaO, 14.6 wt.% Cu, and 53.26 wt.% AgO powders screened to $-325$ mesh (Tyler) were pressed into a 1" diameter pellet. The pellet was heated in air at a rate of 200° C./hr to 970° C. and then held at this temperature for 24 hours after which it was cooled to room temperature. The reaction sintered pellet did not show Meissner effect (levitation of a permanent magnet above a superconducting material immersed in liquid nitrogen) when immersed in liquid nitrogen. The pellet was then cut in half and one half of the sample was then heated in air for 24 hours at 700° C. The sample gained approximately 0.014 grams and this sample exhibite Meissner effect.

A second pellet was then made using the same proportions or reactants. This pellet was heated to 970° C. in air for 24 hours as in the case of the first pellet. However, this pellet was then cooled to 700° C. and held at this temperature for an additional 24 hours. This pellet also showed Meissner effect. Microstructural and x-ray examination of both samples revealed essentially the presence of the superconducting ceramic $YBa_2Cu_3O_7$ type phase and a silver-bearing phase.

Thus, the invention provides an in situ formed superconducting cermet comprising an interwoven matrix of a superconducting ceramic and a conductive material formed in situ by reaction sintering together reactants capable of forming an interwoven matrix of the superconducting ceramic and the conductive material.

Having thus described the invention, what is claimed is:

1. A superconducting cermet comprising an interwoven matrix of a superconducting ceramic and a noble metal which comprises a reaction sintered mixture of:
   (a) a first reactant selected from the class consisting of one or more noble metals in an oxidized state, and a mixture of one or more oxidized noble metals and one or more noble metals;
   (b) one or more rare earth-bearing reactants selected from the class consisting of one or more rare earths in an oxidized state, one or more rare earths in elemental form, and a combination thereof;
   (c) one or more alkaline earth-bearing reactants selected from the class consisting of one or more alkaline earth metals in an oxidized state, one or more alkaline earth metals, and a combination thereof; and
   (d) a copper based reactant selected from the class consisting of copper oxide, an oxide of a copper base alloy, elemental copper, a copper base alloy, and a combination of two or more thereof; wherein at least one of said rare earth-bearing, alkaline earth metal-bearing, or copper based reactants is initially in elemental form and wherein reaction sintering of said reactants together reduces at least a portion of said first reactant and oxidizes at least a portion of said other reactants to form said superconducting cermet in situ.

2. A method of making a superconducting cermet comprising an interwoven matrix of a superconducting ceramic and a noble metal which comprises:
   (a) forming a mixture of:
      (i) a first reactant selected from the class consisting of one or more noble metals in an oxidized state, and a mixture of one or more oxidized noble metals and one or more noble metals;
      (ii) one or more rare earth-bearing reactants selected from the class consisting of one or more rare earths in an oxidized state, one or more rare earths in elemental form, and a combination thereof;
      (iii) one or more alkaline earth-bearing reactants selected from the class consisting of one or more alkaline earth metals in an oxidized state, one or more alkaline earth metals, and a combination thereof; and (iv) a copper based reactant selected from the class consisting of copper oxide, an oxide of a copper base alloy, elemental copper, a copper base alloy, and a combination of two or more thereof;

wherein at least one of said rare earth-bearing, alkaline earth metal-bearing, or copper based reactants is in elemental form; and (b) reaction sintering said reactants together to reduce at least a portion of said first reactant and to oxidize at least a portion of said other reactants to form a superconducting cermet in situ consisting essentially of an interwoven matrix of a noble metal and a superconductive ceramic.

3. The method of claim 8 wherein said step of forming said mixture of reactants further comprises forming said mixture of reactants in a stoichiometric ratio capable of producing an interwoven matrix of said noble metal and a superconducting ceramic having the formula $R_{1+z}M_{2-z}(Cu_{1-y}N_y)_3O_{6.5+x}$ wherein R is one or more rare earth elements capable of reacting to form a superconducting ceramic, M is one or more alkaline earth metal elements capable of reacting to form a super conducting ceramic, x is greater than 0 and less than 0.5, Y is 0 to 0.5, z is 0 to 0.6, and N is a mono-, di-, or trivalent metal.

4. The method of claim 3 wherein said step of forming said mixture further comprises forming a mixture of said reactants wherein a sufficient amount of said initial reactants are in oxide form to supply oxygen to said reaction in an amount sufficient to permit elimination of a subsequent oxidation step.

5. The method of claim 4 wherein said step of forming said mixture of reactants further comprises forming a mixture of said reactants wherein the initial reactants are chosen to provide an exothermic reaction capable of sustaining itself after initial propagation in said reaction sintering step.

6. The method of claim 5 wherein said step of forming said mixture of reactants further comprises adding an amount of superconducting ceramic material formed by previously reacting together rare earth-bearing, alkaline earth metal-bearing, and copper based reactants and wherein the amount of said previously formed superconducting ceramic material added to said mixture is used to control the amount of exothermic heat generated in said reaction sintering step.

7. The method of claim 5 wherein said step of forming said mixture of reactants further comprises adding an amount of said noble metal-bearing reactant in elemental form; wherein the amount of said noble metal added to said mixture in elemental form is used to control the amount of exothermic heat generated in said reaction sintering step.

8. The method of claim 5 which comprises the further step of forming said mixture of reactants into a shaped object prior to said reaction sintering step.

9. The method of claim 8 wherein said step of forming said mixture of reactants further comprises selecting reactants which will provide an exothermic reaction capable of sustaining itself after initial local propagation at a selected area of said shaped object.

10. The method of claim 2 wherein said step of forming said mixture further includes providing a first reactant selected from the class consisting of silver, gold, ruthenium, rhodium, palladium, osmium, iridium, platinum, and mixtures thereof in an oxidized state; and a mixture of one or more of said metals in an oxidized state and one or more of said metals in a reduced state.

11. The method of claim 10 wherein said first reactant consists essentially of a mixture of silver and silver in an oxidized state.

12. The method of claim 10 wherein said first reactant consists essentially of silver in an oxidized state.

13. The method of claim 10 wherein said first reactant consists essentially of silver oxide.

14. The method of claim 2 including the further step of annealing said superconducting cermet in an atmosphere containing oxygen at a temperature of from about 400-750° C. for a period of from about 12-36 hours at ambient or higher pressure.

15. The method of claim 2 which further includes annealing said superconducting cermet in an atmosphere containing oxygen.

16. The method of claim 2 which further includes annealing said superconducting cermet at a time and temperatures sufficient to raise the oxygen content of the superconducting ceramic.

17. The method of claim 2 which further includes mechanically deforming said superconducting cermet.

18. The method of claim 2 which further includes working said superconducting cermet.

19. The method of claim 2 which further includes forging said superconducting cermet.

20. The method of claim 2 which further includes extruding said superconducting cermet.

21. The method of claim 2 including the further steps of:

annealing said superconducting cermet in an atmosphere containing oxygen; and mechanically deforming said superconducting cermet.

* * * * *